United States Patent [19]
Oto

[11] Patent Number: 5,010,400
[45] Date of Patent: Apr. 23, 1991

[54] TELEVISION TUNER FOR RECEIVING MULTIPLE BAND TELEVISION SIGNALS

[75] Inventor: Hideki Oto, Saitama, Japan

[73] Assignee: Kabushiki Kaisha Toshiba, Kanagawa, Japan

[21] Appl. No.: 388,493

[22] Filed: Aug. 2, 1989

[30] Foreign Application Priority Data

Aug. 3, 1988 [JP] Japan ................. 63-193998

[51] Int. Cl.⁵ .......................... H04N 1/00; H04N 7/10
[52] U.S. Cl. ..................... 358/86; 358/191.1; 455/189; 455/190
[58] Field of Search ............ 358/191.1, 193.1, 86; 455/188, 189, 190, 191, 131, 137, 168, 176, 179, 180, 315

[56] References Cited

U.S. PATENT DOCUMENTS

| | | | |
|---|---|---|---|
| 3,639,840 | 2/1972 | Shekel et al. | 455/190 |
| 3,882,266 | 5/1975 | Walding | 358/86 |
| 4,009,441 | 2/1977 | Kumagai et al. | 358/86 |
| 4,191,966 | 3/1980 | Ovnick, Jr. | 358/86 |
| 4,322,856 | 3/1982 | Ohta et al. | 455/189 |
| 4,340,975 | 7/1982 | Onishi et al. | 358/191.1 |
| 4,352,209 | 9/1982 | Ma | 455/189 |
| 4,480,338 | 10/1984 | Dobrovolny | 455/190 |
| 4,491,976 | 1/1985 | Saitoh et al. | 455/189 |
| 4,569,084 | 2/1986 | Takahama | 455/86 |
| 4,633,513 | 12/1986 | Taney | 455/190 |
| 4,731,877 | 3/1988 | Moon | 455/190 |

FOREIGN PATENT DOCUMENTS 0026933 2/1987 Japan ................ 358/191.1

Primary Examiner—Howard W. Britton
Assistant Examiner—Michael H. Lee
Attorney, Agent, or Firm—Finnegan, Henderson, Farabow, Garrett, and Dunner

[57] ABSTRACT

A television tuner for use in a television receiver to receive a VHF band signal, a UHF band signal, and a satellite band signal converted from a received satellite signal, all of which are provided as a combined signal by a signal combiner. The television tuner includes an input terminal to receive the combined signal from the signal combiner, a first oscillator having a variable frequency, a first mixer to receive the combined signal and the output of the first oscillator to convert the combined signal into a first intermediate frequency signal if the VHF and UHF signals are to be utilized by the television receiver, or a second intermediate frequency signal if the satellite signal is to be utilized by the television receiver, first and second band-pass filters connected to the first mixer to receive first and second intermediate frequency signals, wherein the first band-pass filter is designed to pass the first intermediate frequency signal and the second band-pass filter is designed to pass the second intermediate frequency signal, and a processing circuit for processing the signals passed by the first and second band-pass filters to provide a standard VHF and UHF television signals and a frequency modulated satellite signal.

7 Claims, 2 Drawing Sheets

TELEVISION TUNER FOR RECEIVING MULTIPLE BAND TELEVISION SIGNALS

FIELD OF THE INVENTION

The present invention relates generally to a television tuner, and more particularly, to a television tuner for receiving multiple band television signals.

BACKGROUND OF THE INVENTION

Conventionally, television broadcastings using radio transmission are carried out by ground stations. In Japan these conventional television broadcastings utilize the 1st to 12th channels in the VHF band and the 13th to 62nd channels in the UHF band, respectively. These VHF and UHF band television signals are received by VHF and UHF antennas, respectively. These VHF and UHF band television signals are then applied to VHF and UHF tuners of a conventional television receiver, respectively. These VHF and UHF tuners commonly convert the frequencies of the VHF and UHF band television signals to a predetermined intermediate frequency (referred to as IF frequency hereinafter). The television signals with the IF frequency are then applied to a video detector in the conventional television receiver.

In a cable television (referred to as CATV hereinafter) system, the frequency of a UHF band television signal is converted to a frequency in the VHF band. Then, the original VHF band television signals and the converted UHF band television signals are transmited to the VHF tuner of the conventional television receiver through a CATV line.

In a satellite television (referred to as BS television hereinafter) system, a television signal with a carrier frequency around 12 GHz in the SHF band is used. The SHF band carrier signal is frequency modulated by the BS television signal. The SHF band television signal is received by a BS antenna. The received SHF band television signal is then applied to a BS converter. The BS converter converts the frequency of the SHF band to a first IF frequency around 1.0-1.3 GHz (referred to as BS-IF frequency hereinafter). The signal with the BS-IF frequency is applied to a prescribed tuner (referred to as BS tuner hereinafter) of a conventional television receiver. The BS tuner further converts the frequency of the signal to a second IF frequency of around 130 MHz bond or 400 MHz band. Then, the signal with the second IF frequency is frequency demodulated. The FM demodulated signal is applied to the conventional television receiver.

When a user wishes to receive the respective television signals broadcasted from the ground station, the CATV station and the BS station by using a conventional television receiver, many cables must be provided for transmitting the signals from the VHF antenna, the UHF antenna, the BS antenna and a terminal coupled to a CATV main cable.

Therefore, if the user with a TV set adapted to receive television signals of the existing NTSC system utilizes each broadcasting system as described above, in addition to the cable to conduct the output of the VHF and UHF receiving antennas, cables to conduct the output of the CATV converter and BS tuner must be connected to the TV set.

Further, in a community television system, the television signals received by VHF, UHF and SHF community antennas are combined on a single transmission cable. Then the television signals are distributed to each television receiver.

Referring now to FIG. 1, such a conventional community television system adapted for receiving the VHF, UHF and the BS television signals will be briefly explained. In FIG. 1, a BS antenna 11 is provided for receiving the BS band television signal of the SHF band from a BS station. The BS band television signal is converted to the BS-IF signal by a BS converter 11a. The BS-IF signal is applied to a BS-IF cable 11b. Further a VHF antenna 12 and a UHF antenna 13 are provided for receiving the VHF and the UHF television signals from ground stations, respectively. The VHF and UHF television signals are combined by a first power combiner 14. Thus, the VHF and UHF television signals are applied to a common UV cable 14a. The BS-IF signal on the BS-IF cable 11b and the VHF and UHF television signals on the common UV cable 14a are further combined together by a second power combiner 15.

The output of the second power combiner 15 is applied to a main cable 15a. The main cable 15a is conducted to an entrance terminal 16 of a house. The entrance terminal 16 is coupled to a first separator 17 for separating the BS-IF band television signal. The other signals are applied to a second separator 18. The second separator 18 separates the VHF and the UHF band television signals. The VHF, UHF and BS-IF band television signals are the applied to a television receiver through individual tuners (not shown).

As mentioned above, conventionally, in case signals in the VHF band, UHF band and BS-IF band are received, the individual user must lead indoors a cable from the VHF receiving antenna, a cable from the UHF receiving antenna and a cable from the BS antenna, totaling three cables. In addition to this, if CATV is utilized, the connection becomes more complicated.

Moreover, if the user subscribes to a community antenna system, since the assembled signals of the signals in the VHF band, UHF band (including the CATV band) and BS-IF band are fed to the input terminal, the user must divide these into signals of each band employing a branching filter, and the connect a cable to each signal input on the television receiver, similarly to the individual user.

SUMMARY OF THE INVENTION

It is, therefore, an object of the present invention to provide a television tuner for receiving multiple band television signals which is able to convert each of the multiple band television signals to a suitable IF signal.

In order to achieve the above object, a television tuner for use in a television receiver to receive multiple band television signals such as a VHF band signal, a UHF band signal, and a satellite band signal converted from a received satellite signal, all of which are provided as a combined signal by a signal combiner, includes an input teminal to receive the combined signal from the signal combiner, a first oscillator having a variable frequency, a first mixer to receive the combined signal and the output of the first oscillator to convert the combined signal into a first intermediate frequency signal if the VHF and UHF signals are to be utilized by the television receiver or a second intermediate frequency signal if the satellite signal is to be utilized by the television receiver, first and second band-pass filters connected to the first mixer to receive first and second intermediate frequency signals, wherein the first band-pass filter is designed to pass the first intermediate frequency signal and the second band-pass filter means is designed to pass the second intermediate frequency signal, and a processing circuit for processing the signals passed by the first and second band-pass filters to provide a standard VHF and UHF television signals and a frequency modulated satellite signal.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
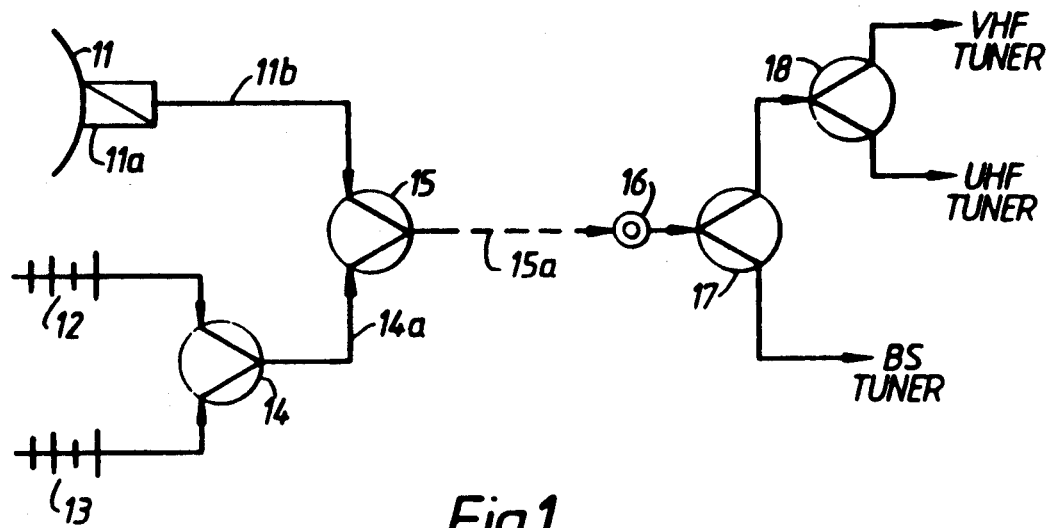
FIG. 1 is a cable wiring diagram illustrating the transmission of TV signals to each house in a conventional community antenna system.

The present invention will be described in detail with reference to the FIGS. 2 and 3. Throughout the drawings, reference numerals or letters used in FIG. 1 will be used to designate like or equivalent elements for simplicity of explanation.

Figure 2:
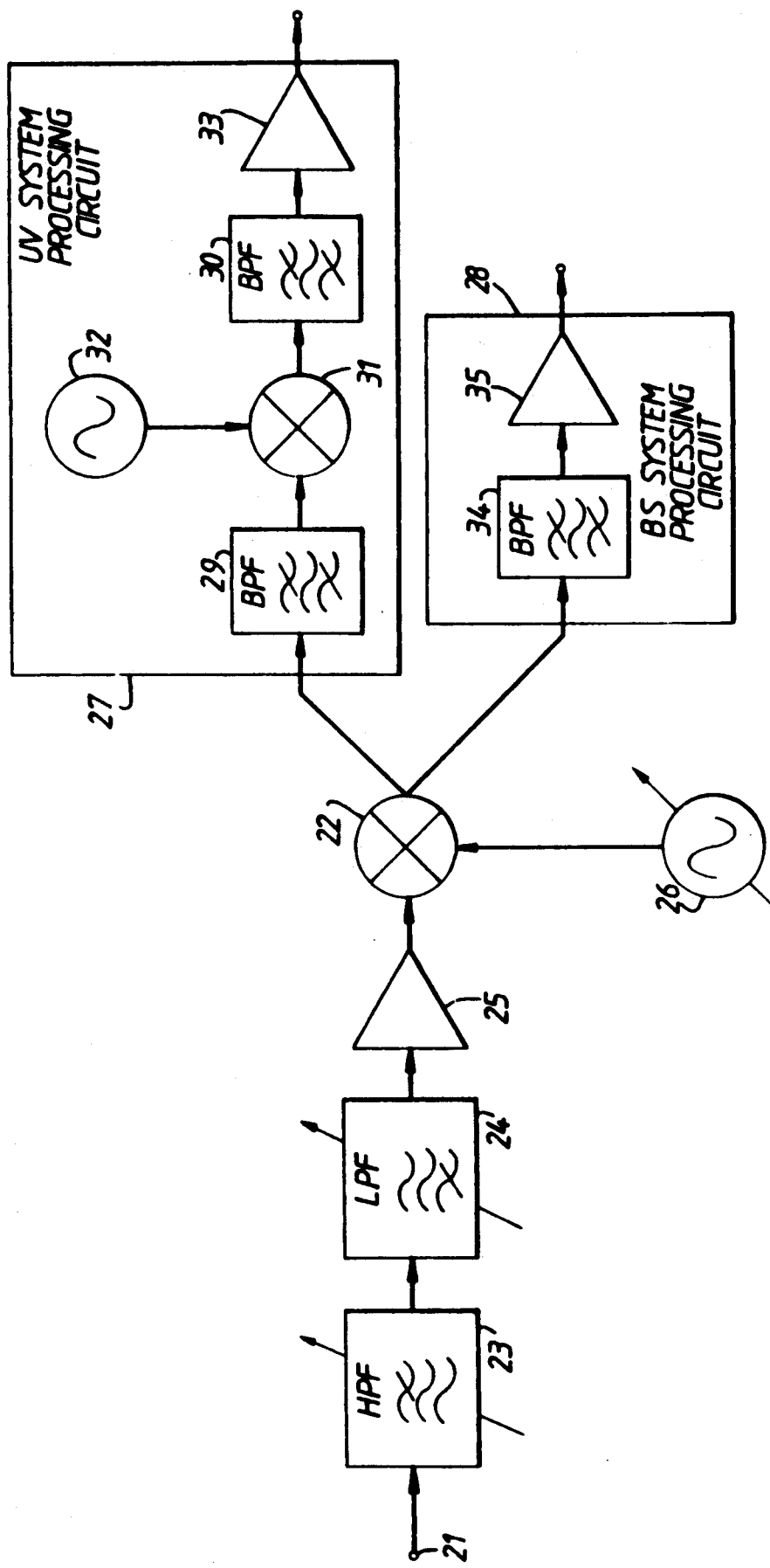
FIG. 2 is a block diagram showing an embodiment of the television tuner related to this invention.

Referring now to FIG. 2, a first embodiment of the television tuner for receiving multiple band television signals according to the present invention will be described in detail. In FIG. 2, an input terminal 21 is provided for receiving multiple band television signals, e.g., the VMF band television signal, the UHF band television signal and the BS-IF band television signal. These television signals are transmitted to the input terminal through a common cable, such as the line 15a of the conventional system, as shown in FIG. 1. The VHF band television signal extends over, for example, the frequency of 90 to 470 MHz. The UHF band television signal extends over, for example, the frequency of 470 to 770 MHz. The BS-IF band television signal extends over the frequency of 1,035 to 1,332 MHz.

These television signals from the input terminal 21 are applied to a first mixer 22 through a high-pass filter 23, a low-pass filter 24 and a broad band amplifier 25, in turn. The high-pass filter 23 and the low-pass filter 24 have variable cut-off frequencies. The cut-off frequencies are changed for every band. That is, in the reception of the VHF band television signal the cut-off frequencies of the high-pass filter 23 and a low-pass filter 24 are changed to 90 MHz and 470 MHz, respectively. In the reception of the UHF band television signal the cut-off frequencies of the high-pass filter 23 and a low-pass filter 24 are changed to 470 MHz and 770 MHz, respectively. In the reception of the BS-IF band television signal the cut-off frequencies of the high-pass filter 23 and a low-pass filter 24 are changed to 1035 MHz and 1332 MHz, respectively. Such a cut-off frequency change may be carried out by changing control voltages applied to variable capacitance diodes constituting the filters.

The broad band amplifier 25 has a frequency range, i.e., 90 to 1332 MHz, adapted for amplifying all of the VHF, the UHF and the BS-IF band television signals. Thus, the VHF, the UHF and the BS-IF band television signals are selectively applied to the first mixer 22.

A first local oscillator 26 is coupled to the first mixer 22. Thus, the first local oscillator 26 and the first mixer 22 constitute a first frequency converter. The first frequency converter converts the VHF, the UHF and the BS-IF band television signals to a first IF signal. The oscillation frequency of the first local oscillator 26 varies in a frequency range between about 1070 to 1730 MHz according to a tuning operation. Thus, the first IF signal has a center frequency of 955.75 MHz for the reception of the VHF and the UHF band television signal, respectively. The first IF signal has a center frequency of 402.78 MHz for the reception of the BS-IF band television signal.

The first mixer 22 is coupled &o both a UV system processing circuit 27 and a BS system processing circuit 28 in parallel. The UV system processing circuit 27 includes a first and a second band-pass filters 29 and 30, a second mixer 31, a second local oscillator 32 and an amplifier 33. The BS system processing circuit 28 includes a third band-pass filter 34 and an amplifier 35.

The first band-pass filter 29 selectively transmits the first IF signal with a center frequency of 955.75 MHz. The third band-pass filter 34 selectively transmits the the first IF signal with a center frequency of 402.78 MHz. Thus the IF signals converted from the VHF and the UHF Band television signals are applied to the UV system processing circuit 27. The IF signal converted from the BS-IF band television signal is applied to the BS system processing circuit 28.

In the UV system processing circuit 27 the first IF signal transmitted through the first band-pass filter 29 is applied to the second mixer 31. The second local oscillator 32 is coupled to the second mixer 31. Thus, the second local oscillator 32 and the second mixer 31 together constitute a second frequency converter. The second local oscillator 32 has a fixed oscillation frequency. Thus, the second frequency converter converts the first IF signal with the center frequency of 955.75 MHz to a second IF signal with a center frequency of 58.75 MHz. The second IF signal is applied to the amplifier 33 through the second band-pass filter 30. The second band-pass filter 30 is constituted by, for example, a conventional double-tuned circuit and has a frequency range of about 6 MHz. Thus, the VHF and UHF band television signals are obtained through a UV band output terminal 36. These signals are applied to a video detector of a conventional television receiver.

In the BS-IF system processing circuit 28 the third band-pass filter 34 has a frequency range of about 27 MHz. The first IF signal transmitted through the third band-pass filter 34 is applied to the amplifier 35. Thus, the BS band television signal is obtained through a BS band output terminal 37. The signal is applied to the conventional television receiver through an FM demodulator (not shown).

The television tuner according to the first embodiment can be included in a conventional television receiver. Thus, all television signals currently provided, i.e., the VHF, the UHF and the BS band television signals, are easily received. According to the first embodiment of the television tuner, the input terminal 21 is coupled to a plurality of antennas, i.e., the VHF, the UHF and the BS antennas, through a common cable. The VHF, the UHF and the BS band television signals received by individual antennas are combined together in a conventional manner and applied to the common cable. In case of a community television antenna system, the television tuner can be connected to a main line without any separator for separating the VHF, the UHF and the BS-IF band television signals. Further, different band television signals, such as the VHF, the UHF and the BS-IF band television signals, are converted to respective IF signals by using this tuner only.

Figure 3:
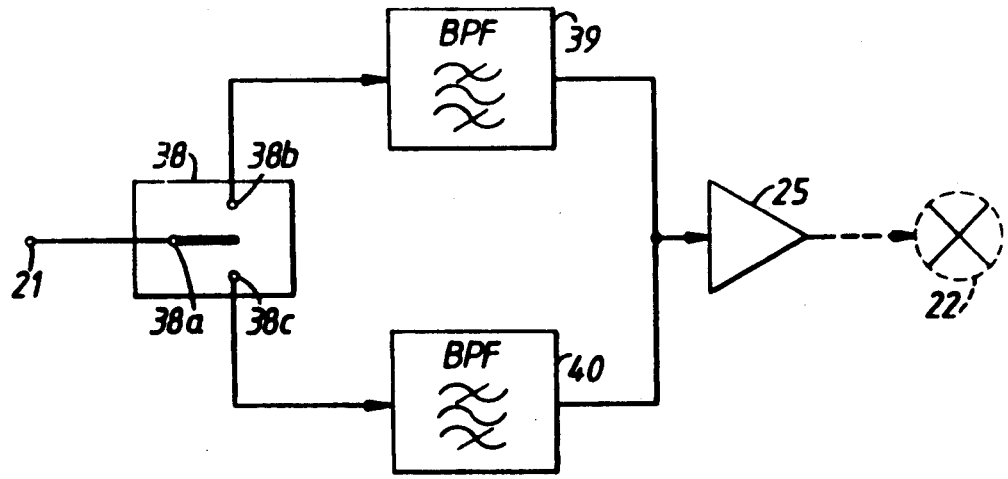
FIG. 3 a block diagram showing a modification of a part of FIG. 2.

Referring now to FIG. 3, a modification of the television tuner will be briefly described. This modification is directed to the high-pass filter 23 and the low-pass filter 24 of FIG. 2, and involves adding additional band-pass filters 39 and 40.

In FIG. 3, an input terminal 21 is coupled to a movable terminal 38a of a switch 38. First and second fixed terminals 38b and 38c of the switch 38 are coupled to a fourth and a fifth band-pass filters 39 and 40, respectively. The movable terminal 38a is selectively connected to the first and second fixed terminals 38b and 38c according to band selection between both the VHF and the UHF bands, and the BS-IF band. The fourth band-pass filter 39 has a fixed frequency range of 90 to 770 MHz. Thus, the VHF and the UHF band television signals are applied to the fourth band-pass filter 39. The fifth band-pass filter 40 has a fixed frequency range of 1035 to 1332 MHz. Thus, the BS-IF band television signal is applied to the fifth band-pass filter 40. These television signals are commonly applied to the first mixer 22 of FIG. 2 through a broad band amplifier 25.

The modification as shown in FIG. 3 is also able to selectively transmit the VHF the UHF and the BS-IF signals to the first mixer 22. In this modification, however, the fourth and the fifth band-pass filters 39 and 40 have fixed individual frequency ranges. On the other hand, the high-pass filter 23 and the low-pass filter 24 have variable cut-off frequencies. Thus, the modification as shown in FIG. 3 has better filtering characteristics in comparison to the embodiment shown in FIG. 2.

Finally, it is easy to change the frequency range of the third band-pass filter 34 in the BS system processing circuit 28 according to other channel or band systems of a satellite broadcasting channel, if necessary.

As described above, the present invention can provide an extremely preferable television tuner for receiving multiple band television signals.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that &he present invention include all embodiments falling within the scope of the appended claims.

WHAT IS CLAIMED IS:

1. A television tuner for use in a television receiver to receive a VHF signal band, a UHF signal band, and a satellite signal band converted from a received satellite signal, all of which are provided as a combined signal by a
    an input means to receive the combined signal from the signal combiner;
    first oscillator having variable frequency;
    first mixer means to receive the combined signal and the output of the first oscillator means to convert the combined signal into a first intermediate frequency signal if the VHF and UHF signals are to be utilized by the television receiver or a second intermediate frequency signal if the satellite signal is to be utilized by the television receiver;
    first and second band-pass filter means connected to the first mixer means to receive first and second intermediate frequency signals, wherein the first band-pass filter means is designed to pass the first intermediate frequency signal and the second band-pass filter means is designed to pass the second intermediate frequency signal; and
    means for processing the signals passed by the first and second band-pass filter means to provide a standard VHF and UHF television signals and a frequency modulated satellite signal.

2. A television tuner as in claim 1, wherein the means for processing the signals includes:
    a second oscillator means having a fixed frequency;
    a second mixer means for receiving the output of the second oscillator means and the output of the first bandpass filter means to generate a signal having a third intermediate frequency;
    a third band-pass filter means for receiving the third intermediate frequency signal; and
    a first amplifier means connected to the output of the third band-pass filter means for outputting the standard television IF frequency of the VHF and UHF television signals.

3. A television tuner as in claim 1, wherein the means for processing the signals includes:
    a second amplifier means connected to the output of the second band-pass filter means for outputting the frequency modulated satellite signal.

4. A television tuner as in claim 1, wherein the input means includes filter means for selectively transmitting at least one of the VHF, UHF and satellite band signals received as part of the combined signal.

5. A television tuner as in claim 4, wherein the filter means includes a low-pass filter and a high-pass filter, each having variable cut-off frequencies.

6. A television tuner as in claim 4, wherein the filter means includes at least two band-pass filters, each having fixed frequency ranges, and a switching means for selectively switching the combined signal between the at least two band-pass filters.

7. A television tuner for use in a television receiver to receive multiple band television signals, all of which are provided as a combined signal by a signal combiner, comprising:
    an input means to receive the combined signal from the signal combiner;
    first oscillator means having a variable frequency;
    first mixer means to receive the combined signal and the output of the first oscillator means to convert the combined signal into a first intermediate frequency signal if a prescribed one of the band television signals to be utilized by the television receiver or a second intermediate frequency signal if another one of the band television signals is to be utilized by the television receiver;

first and second band-pass filter means connected to the first mixer means to receive first and second intermediate frequency signals, wherein the first band-pass filter means is designed to pass the first intermediate frequency signal and the second band-pass filter means is designed to pass the second intermediate frequency signal; and means for processing the signals passed by the first and second band-pass filter means to provide standard television signals.

* * * * *

UNITED STATES PATENT AND TRADEMARK OFFICE
CERTIFICATE OF CORRECTION

PATENT NO. : 5,010,400
DATED : April 23, 1991
INVENTOR(S) : Hideki OTO It is certified that error appears in the above-identified patent and that said Letters Patent is hereby corrected as shown below:

Claim 1, column 5, line 68, change "eceive" to --receive--.

Claim 1, column 6, line 3, after "a" insert --signal combiner, comprising: --

Claim 1, column 6, line 6, change "having" to --means having a--.

Claim 2, column 6, line 30, change "bandpass" to --band-pass--.

Signed and Sealed this

Twentieth Day of April, 1993

Attest:

MICHAEL K. KIRK

Attesting Officer

Acting Commissioner of Patents and Trademarks